(12) United States Patent
Luk et al.

(10) Patent No.: US 10,531,573 B2
(45) Date of Patent: Jan. 7, 2020

(54) ELECTRICAL COMPONENT PACKAGE WITH REINFORCED MOLDED PINS

(71) Applicant: XFMRS, Inc., Camby, IN (US)

(72) Inventors: Tung Kong Luk, Tsuen Wan (HK); Yu kun Liao, GuangDong (CN)

(73) Assignee: XFMRS, Inc., Camby, IN (US)

( * ) Notice: Subject to any disclaimer, the term of this patent is extended or adjusted under 35 U.S.C. 154(b) by 151 days.

(21) Appl. No.: 15/337,180

(22) Filed: Oct. 28, 2016

(65) Prior Publication Data

US 2018/0122547 A1 May 3, 2018

(51) Int. Cl.
*H01F 27/02* (2006.01)
*H05K 3/34* (2006.01)
*H01R 12/57* (2011.01)
*H01F 27/29* (2006.01)

(52) U.S. Cl.
CPC ........... *H05K 3/3421* (2013.01); *H01R 12/57* (2013.01)

(58) Field of Classification Search
CPC ........ H01F 27/02; H01F 27/022; H01F 27/06; H01F 27/027; H01L 2974/181; H01L 23/645
USPC .......................................................... 336/90
See application file for complete search history.

(56) References Cited

U.S. PATENT DOCUMENTS

| | | | | |
|---|---|---|---|---|
| 3,076,165 A * | 1/1963 | Weyrich | ................. | H05K 3/301 336/192 |
| 4,092,622 A * | 5/1978 | Widemann | ................ | H01F 5/04 336/192 |
| 5,294,826 A * | 3/1994 | Marcantonio | ......... | H01L 23/315 257/659 |
| 5,446,958 A * | 9/1995 | Hoang | .................... | H01F 41/10 29/564.6 |
| 5,581,118 A * | 12/1996 | Mays | .................. | H01L 21/4842 257/666 |
| 6,118,364 A * | 9/2000 | Hashimoto | ........... | H01F 27/027 336/192 |
| 6,133,525 A | 10/2000 | Yang et al. | | |
| 6,208,232 B1 | 3/2001 | Chen | | |
| 6,225,560 B1 | 5/2001 | Machado | | |
| 6,518,501 B1 * | 2/2003 | Kawahara | ............. | H01L 23/055 174/536 |

(Continued)

*Primary Examiner* — Elvin G Enad
*Assistant Examiner* — Joselito S. Baisa
(74) *Attorney, Agent, or Firm* — Maginot, Moore & Beck LLP (57) ABSTRACT

An electronic device package includes a molded case and a plurality of leads. The molded case includes integrally formed side walls, end walls, and a top wall, the side walls, end walls and top wall defining an interior for receiving one or more electronic components. Each side wall includes a top portion, an intermediate portion, and a bottom portion. The top portion includes plate-like structure having first and second surfaces extending downward from the top wall. The intermediate portion includes a shelf structure having a shelf surface that extends from the first surface in a direction away from the interior, and a third surface extending downward from the shelf surface. The bottom portion extends downward from the intermediate portion. The leads are molded at least in part of the intermediate portion. Each lead has a first end portion exposed in the interior, and a second end portion extending along a bottom edge of the bottom portion.

19 Claims, 6 Drawing Sheets

(56) References Cited

U.S. PATENT DOCUMENTS

| | | | | |
|---|---|---|---|---|
| 6,593,840 B2* | 7/2003 | Morrison | ............... | H01F 27/292 |
| | | | | 336/192 |
| 7,326,084 B1 | 2/2008 | Chen | | |
| 7,948,771 B2 | 5/2011 | Zhang | | |
| 8,031,040 B1* | 10/2011 | Folker | ............... | H01F 5/02 |
| | | | | 336/192 |
| 8,203,853 B2* | 6/2012 | Chen | ............... | H01F 17/062 |
| | | | | 336/65 |
| 8,619,436 B2* | 12/2013 | Zhang | ............... | H05K 5/0091 |
| | | | | 174/520 |
| 8,723,308 B2* | 5/2014 | Yang | ............... | B81B 7/0064 |
| | | | | 257/698 |
| 8,854,167 B2* | 10/2014 | Lin | ............... | H05K 5/0095 |
| | | | | 336/200 |
| 2001/0041424 A1* | 11/2001 | Matsuura | ............... | H01L 21/4835 |
| | | | | 438/461 |
| 2010/0142173 A1* | 6/2010 | Chen | ............... | H01F 17/062 |
| | | | | 361/811 |
| 2014/0196540 A1* | 7/2014 | Martizon, Jr. | ............... | B81C 3/008 |
| | | | | 73/504.02 |
| 2014/0340184 A1* | 11/2014 | Itoh | ............... | H01F 27/02 |
| | | | | 336/90 |
| 2016/0172316 A1* | 6/2016 | Taguchi | ............... | H01L 23/49541 |
| | | | | 257/666 |

\* cited by examiner

ELECTRICAL COMPONENT PACKAGE WITH REINFORCED MOLDED PINS

FIELD OF THE INVENTION

The present invention relates generally to packages for electrical components, and in particular, for packages for mounting electrical components to a circuit board.

BACKGROUND

Surface mount technology is a technology for mounting electrical and electronic components to a printed circuit board. In many cases, the electronic components that are mounted on the printed circuit board are arranged in packages having conductive pins. The package is often in the form of a housing in which digital electronic devices, processors, transistors, and groups of analog devices are contained.

The surface mount process includes placing such component packages on predetermined locations on the printed circuit board such that the conductive pins contact predetermined traces on the printed circuit board. The board then undergoes a soldering process, such as an infrared (IR) reflow process, which distributes solder to electrically and physically connect pins of the packages onto conductors on the printed circuit board at the predetermined locations.

Dual in-line surface mount packages are a form of surface mount package that includes a case or container and two rows of surface mount pins or leads. The case can contain a chip, passive electrical components and/or RF components, among things. One type of package can include small coils, which are used for chokes or transformers. Such devices include one or more conductive coils wrapped around a toroidal core. The ends of the wires are typically electrically connected to respective surface mount pins, to allow circuit connection through the devices. The pins, in turn, are soldered to conductive traces on the printed circuit board as discussed above.

Such devices are known, but can have issues during circuit board assembly that lead to unreliability. Other known devices require manufacturing steps that can lead to damage, or are otherwise complex and costly.

One known device for housing transformers in a surface mount package is an open bottom transformer case disclosed in U.S. Pat. No. 5,656,985 to Lu. U.S. Pat. No. 5,656,985 shows a surface mount package including transformers in an open bottom molded package. The coils of the transformers are connected to dual-in-line pins, which have been bent in a gull wing design. The pins are molded into the case, but are then subject to multiple bends after molding. The long, gull-wing shaped pin can be prone to damage because of the length of metal that is cantilevered from the body of the case. Such damage can occur before or during placement.

Other designs have been proposed, but which contain similar drawbacks, and/or introduce even more complexity in the manufacturing process.

SUMMARY

At least some embodiments of the present invention improve upon the state of the art by providing a case in which the surface mount pins extend along a bottom edge of the case, thereby substantially eliminating the risk of bending. Other embodiments include other or additional features that result in manufacturing and/or use advantages.

A first embodiment of the invention is an electronic device package that includes a molded case and a plurality of leads. The molded case includes integrally formed side walls, end walls, and a top wall, the side walls, end walls and top wall defining an interior for receiving one or more electronic components. Each side wall includes a top portion, an intermediate portion, and a bottom portion. The top portion includes plate-like structure having first and second surfaces extending downward from the top wall. The intermediate portion includes a shelf structure having a shelf surface that extends from the first surface in a direction away from the interior, and a third surface extending downward from the shelf surface. The bottom portion extends downward from the intermediate portion. The leads are molded at least in part of the intermediate portion. Each lead has a first end portion exposed in the interior, and a second end portion extending along a bottom edge of the bottom portion.

The above-described features and advantages, as well as others, will become more readily apparent to those of ordinary skill in the art by reference to the following detailed description and accompanying drawings.

DETAILED DESCRIPTION

Figure 1:
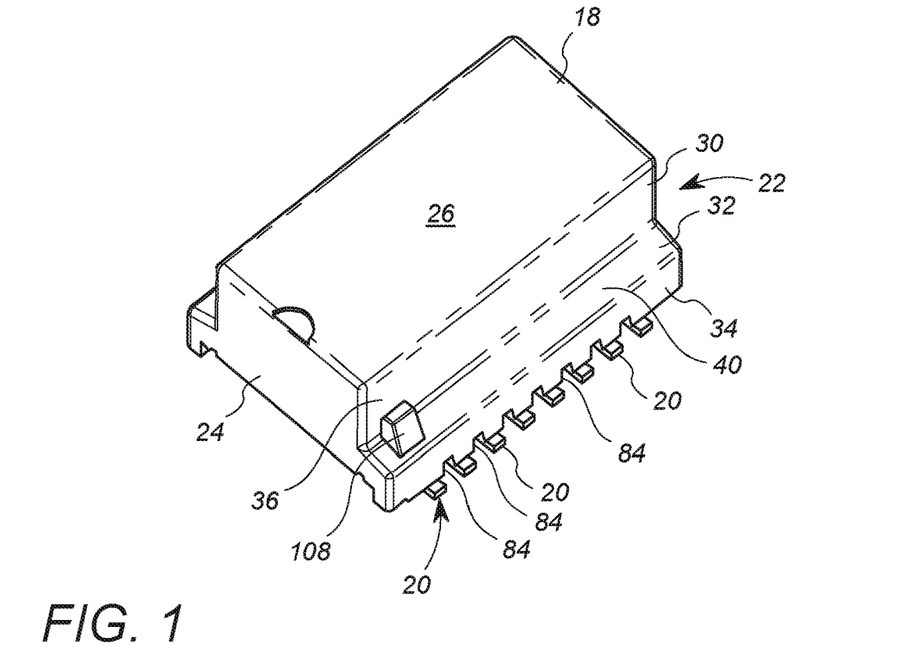
FIG. 1 shows a top perspective view of an electronic device package according to a first exemplary embodiment of the invention.
Figure 2:
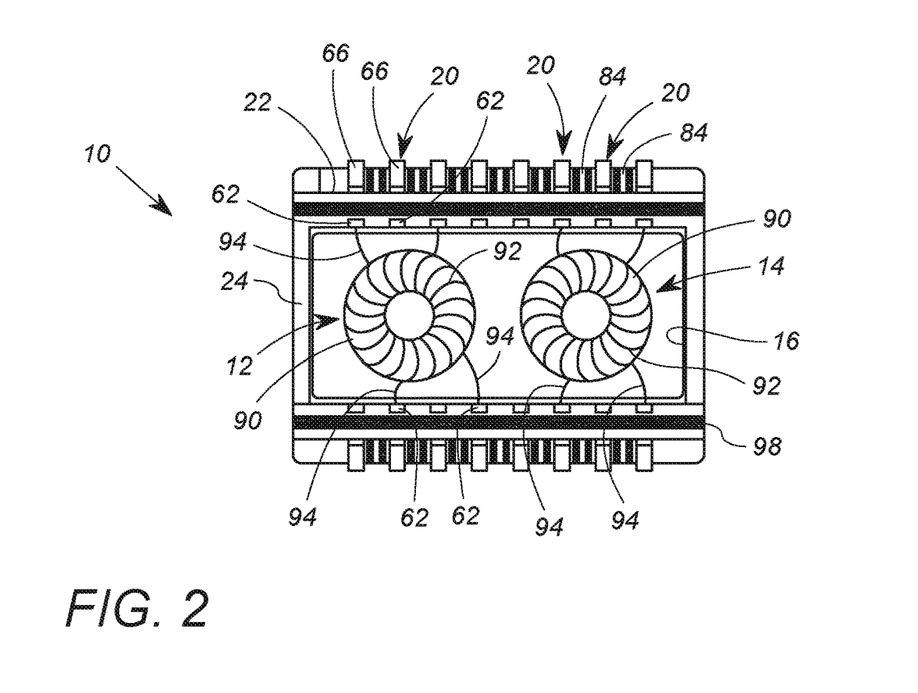
FIG. 2 shows a bottom plan view of the electronic device package of FIG. 1, with two electronic devices mounted therein.
Figure 3:
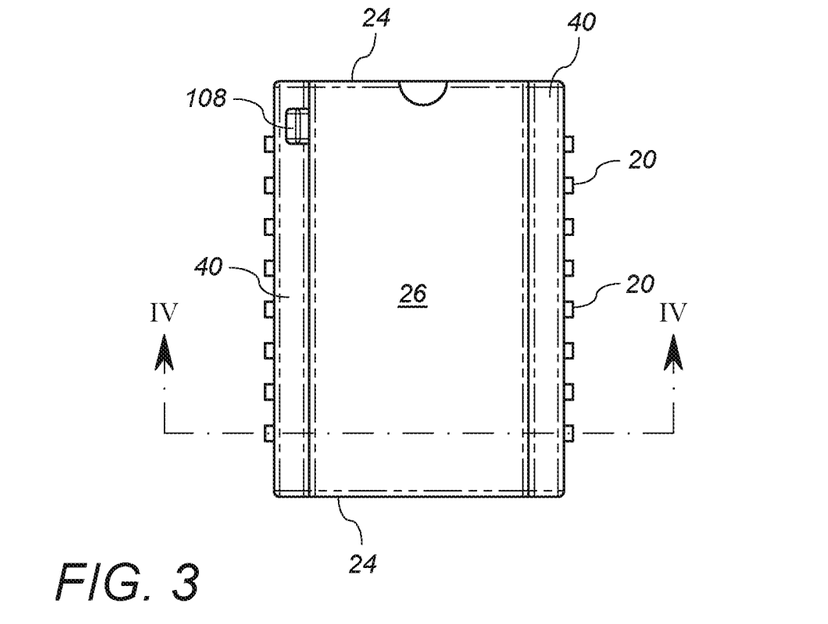
FIG. 3 shows a top plan view of the electronic device package of FIG. 1.

FIG. 1 shows a top perspective view of a first embodiment of an electronic device package 10 incorporating features of the invention. The first embodiment is arranged as a dual in-line package 10 having sixteen pins or leads 20. The package 10 may be used to house electrical components. To this end, FIG. 2 shows a bottom plan view of the package 10 having a first toroid 12 and a second toroid 14 mounted on the package 10. FIGS. 3-6 show other views of the package 10 without the toroids 12 and 14 mounted therein. Like elements in FIGS. 1 to 6 bear the same reference numbers.

With contemporaneous reference to FIGS. 1 to 6, the electronic device package 10 includes a molded case 18 and conductive pins or leads 20 molded into the case 18. To this end, the case 18 may be molded out of a suitable, non-electrically-conductive material. The leads 20 may be copper, or another suitable electrically conductive, and preferably pliable, material.

The case 18 includes integrally formed side walls 22, end walls 24, and a top wall 26. The top wall 26 in this embodiment has a rectangular shape. The side walls 22 extend generally downward from opposite edges of the top wall 26, and the end walls 24 extend generally downward from the other opposite edges of the top wall 26 Accordingly, the side walls 22, end walls 24 and top wall 26 define an interior 16 for receiving one or more electronic components. In the example of FIG. 2, the first toroid 12 and the second toroid 14 may be the electronic components mounted in the interior 16.

Figure 4:
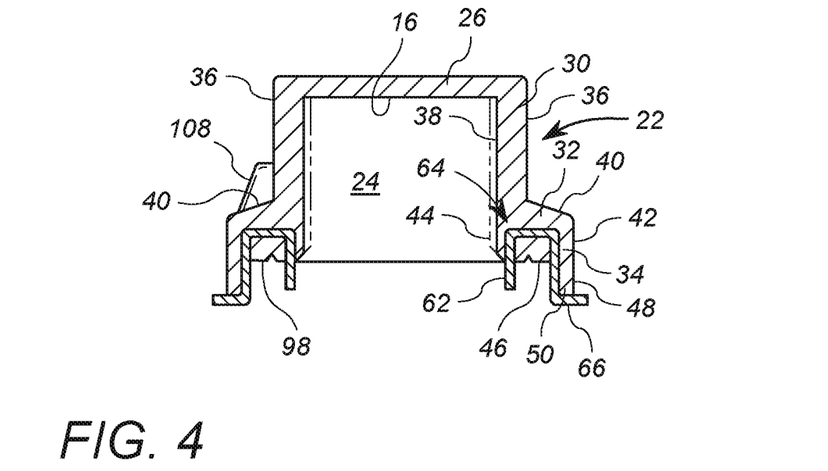
FIG. 4 shows a cutaway view of the electronic device package of FIG. 1 taken along line IV-IV of FIG. 3.

With specific reference to FIGS. 1 and 4, each side wall 22 includes a top portion 30, an intermediate portion 32, and a bottom portion 34. The top portion 30 comprises a plate-like structure having first and second surfaces 36, 38, respectively, extending downward from the top wall 26. The top wall 26 also preferably defines a flat plate-like structure, but may be a plate-like structure having other shapes such as curved, arched, peaked, or even corrugated.

Referring again to the sidewall, the first surface 36 defines an outer surface of the top portion 30, and the second surface 38 defining an inner surface of the top portion 30, such that the second surface 38 borders the interior 16. In this embodiment, both the first and second surfaces 36, 38 extend vertically downward, and are in substantially parallel planes. However, it will be appreciated that the first and second surface 36, 38 can extend downward in a slightly or even moderate inclined manner. For molding purposes, any incline downward from the top wall 26 should be outward from the interior 16. It will also be appreciated that the surfaces 36, 38 need not be in parallel planes.

Figure 5:
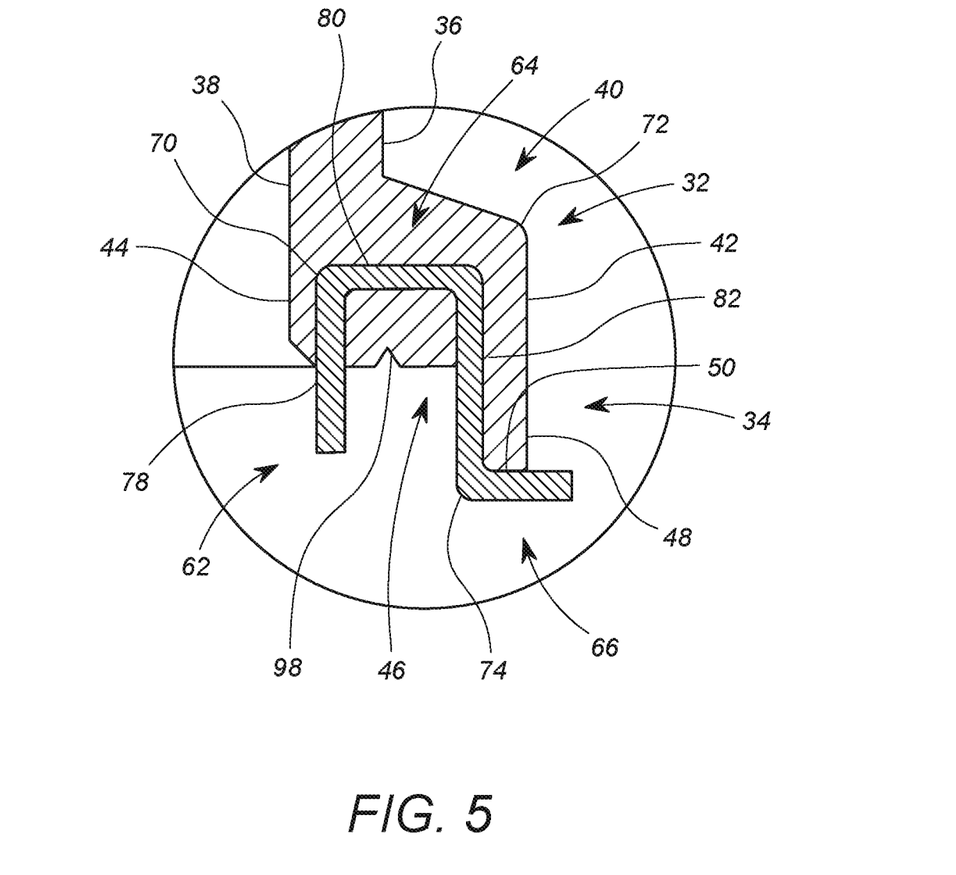
FIG. 5 shows an enlarged, fragmentary portion of the cutaway view of the electronic device package shown in FIG. 4.

With reference to FIGS. 4 and 5, the intermediate portion 32 of the side wall 22 includes a shelf structure having a shelf surface 40 that extends from the first surface 36 in a direction away from the interior, and an outer surface 42 that extends downward from the shelf surface 40. The intermediate portion 32 in this embodiment includes an inner surface 44 that extends downward in a coplanar manner from second surface 38 of the top portion 30. The intermediate portion 32 also includes a bottom surface 46. Due to the outward extension of the shelf surface 40, the intermediate portion 32 has an increased thickness between the outer surface 42 and the inner surface 44.

The bottom portion 34 extends downward from the intermediate portion 32, and includes an outer surface 48 and a bottom edge 50. The outer surface 48 of the bottom portion 34 extends downward in a coplanar manner from the outer surface 42 of the intermediate portion 32.

Referring again generally to FIGS. 1 to 6, each end wall 24 in this embodiment comprises a generally rectangular plate-like structure that extends between the opposing side walls 22 from the top wall 26 to a position level with the bottom surface 46 of the intermediate portions 32 of the side walls.

In the embodiment of FIGS. 1 to 6, the package 10 includes sixteen leads 20, eight of which are molded into each side wall 22, spaced apart from each other. In particular, the leads 20 are molded at least in part of the intermediate portion 32 of the side wall 22. Each lead 20 includes a first end portion, referred to as a lead end or post 62 exposed in the interior 16, an intermediate portion 64, and a second end portion 66 that extends along the bottom edge 50 of the bottom portion 34.

The intermediate portion 64 that extends upward from the first lead end or post 62 into the bottom surface 46 of the intermediate portion 32 of the side wall 22, extends thence laterally within the thicker intermediate portion 32 of the sidewall 22, and thence downward toward the second end portion 66 through the bottom surface 46. The intermediate portion 64 thus includes three bends or rounded corners 70, 72, 74. The corner 70 defines the intersection of the part 78 of the intermediate portion 32 that extends towards the post 62, and the part 80 of the intermediate portion 32 that extends laterally within the intermediate portion 32. The corner 72 defines the intersection between the part 80 and a part 82 that extends downward toward the second end portion referred to as the second lead end 66 through the bottom surface 46 of the intermediate portion 32. The part 82 also extends along or partly inside the inner surface of the bottom portion 34 of the side wall 22. The corner 74 defines the intersection of the part 82 and the second lead end 66. The parts 78, 80, and 82 thus form a c-shape of the intermediate portion 64 of the lead 20.

One feature of the design of the package 10 described above is that only a single load-bearing bend or corner 74 of the lead is exposed, due to the disposition of the two corners 70, 72 that define the c-shape within the molded plastic of the intermediate portion 32. The result is a stronger device less liable to damage compared to prior art gull-wing lead designs having multiple bends on load bearing portions of the lead. In addition, the second lead end 66, which is intended to be surface mounted to a printed circuit board, is structurally reinforced by extending along the bottom edge 50 of the side wall 22. Thus, the downward pressure applied by placement of the package 10 on a printed circuit board, no shown, is less prone to damage in comparison to prior art designs where the contact portions of the leads are cantilevered in a gull-wing design.

Figure 6:
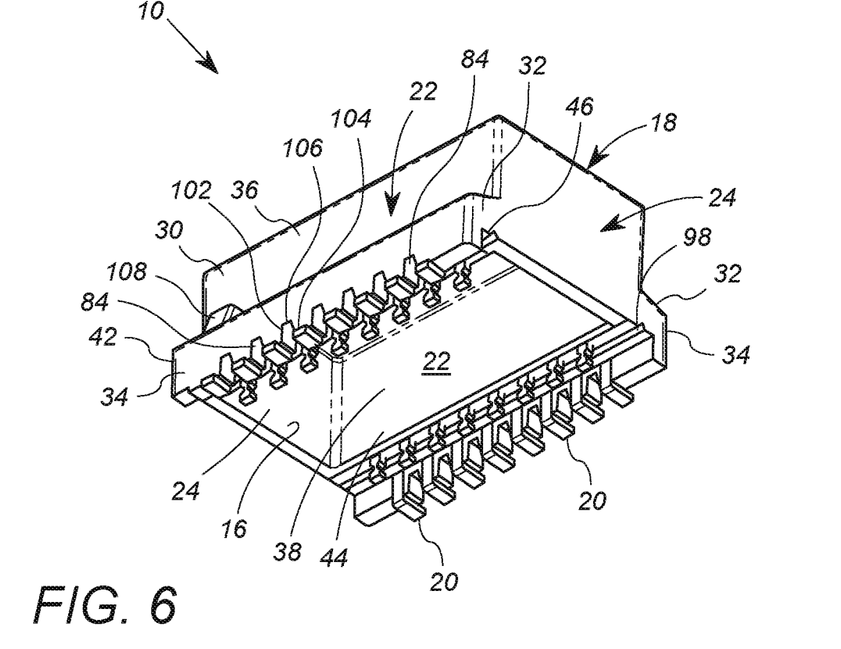
FIG. 6 shows a bottom perspective view of the electronic device package of FIG. 1.
Figure 7:
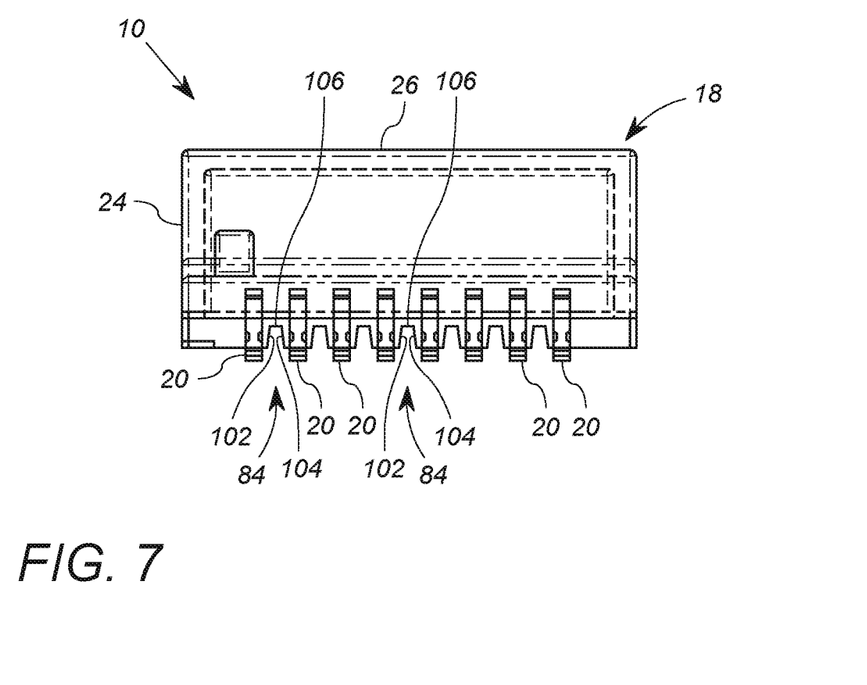
FIG. 7 shows a side perspective view of the electronic device package of FIG. 1.

The package 10 is intended for use as a surface mount device, which means that the second lead ends 66 are typically electrically connected to traces of a printed circuit board using IR reflow processes. Because the IR reflow process can cause gasses to form or collect, proper ventilation of the interior 16 is desirable. To this end, as shown in FIGS. 1, 6 and 7, the bottom portion 34 of the side wall 22 includes notches 84 defined in spaces between adjacent leads 20. The notches 84 extend through the bottom portion 34 of the side wall 22, and extend upward most of the distance through the bottom portion 34 toward the bottom of the intermediate portion 32 of the side wall 22. Referring to FIGS. 6 and 7, each notch 84 is defined by inclined side walls 102, 104 that extend upward and slightly inward toward each other, and a top wall 106 that extends between the tops of the inclined side walls 102, 104, and is disposed at a level just below the bottom surface 46 of the intermediate portion 32 of the side wall 22. As shown most clearly in FIG. 7, the lowest portion of each of the inclined side walls 102, 104 is spaced apart from the nearest lead 20 by a distance that is approximately 15% to 30% the width of the space between adjacent leads 20.

While the notches 84 may alternatively have other shapes, the trapezoidal shape of the notches 84 shown in FIGS. 1, 6 and 7 provide additional structural support at the top of the notch 84 while increased gas flow space near the bottom of the notch 84.

As discussed above, the package 10 is intended to carry electronic devices, and preferably devices that include at least one wire coil wrapped around a toroid core. Referring again to FIG. 2, for example, the first toroid 12 includes a donut-shaped toroidal core 90, and wires 92 wrapped around core 90. The wires 92 include wire ends 94, each wire end 94 electrically and physically directly coupled to the first lead end 62 of a respective lead 20. In this manner, electrical connections from a circuit board to the first toroid 12 can be accomplished by soldering traces of the printed circuit board to the second lead end 66 of select leads 20 of the package 10, which in turn conduct electrical signals to the first lead end 62 and hence wires 92 of the first toroid 12.

Another feature of the embodiment of FIGS. 1 to 6 relates the manufacturing process, and specifically, coupling the wire ends 94 to the respective first lead ends 62 after installation of the toroids 12, 14. In general, once the toroids 12, 14 are mounted in the interior 16 (by epoxy, or other means), the wire ends 94 are wrapped around respective first lead ends 62. To enable manipulation of the wire end 94 around the posts or lead ends 62, excess wire is provided. After the wire end 94 is wrapped around the post 62, the excess wire must be cut to avoid spurious contact with other lead ends 62, wire ends 94, or even with traces of the printed circuit board on which package 10 is mounted. In accordance with embodiments of the present invention, the bottom surface 46 of the intermediate portion 32 of the side wall 22 includes a channel 98 disposed between a position at which the intermediate portion 64 of the lead 20 that extends to the first lead end 62 (i.e. part 78) and a position at which the intermediate portion 64 of the lead 20 extends towards the second lead end 66 (i.e. part 82). (See FIGS. 4, 5 and 6).

For example, the channel 98 is disposed roughly one-third of the distance from the inner surface or wall 44 to the outer surface or wall 42 of the intermediate portion 32 of the side wall 22. In any event, the channel 98 provides a guide and/or receptacle for a linear cutting blade, not shown, to trim the excess wire from the wire ends 94. To this end, the channel 98 is preferably v-shaped, and relatively shallow.

Referring to FIG. 2, it will be appreciated that after the wire ends 94 are wrapped around the first lead ends 92, the remaining excess wire for each wire end 94 is laid perpendicularly across the closest one of the channels 98. A straight edge blade is then thrust into or along the each channel 98 to cut the excess wire. This process allows for multiple wire ends 94 to be trimmed with a single manufacturing step. In the prior art, wire ends 94 were individually trimmed. Thus, in the case of the example of FIG. 2, a single cutting step on one channel 98 would trim four wire ends 94, and a single cutting step on the opposite channel would trim four more wire ends 94. In the past, each of the four wire ends 94 on each side would have been trimmed individually. The channel 98 in such an example reduces eight trimming procedures to only two trimming procedures. It can be seen that in devices having more wires, the gain in efficiency is even greater.

Still another feature of the package 10 of FIGS. 1 to 6 is an orientation indicating feature 108 which aids the automated placement of the package 10. The orientation indicating feature 108 is a discontinuity molded into the shelf surface 40 of the intermediate portion 32 and/or the first surface 36 of the upper portion 30 of the side wall 22, located in a position that is asymmetrical along the length and width of the package 10. (See FIGS. 1, 3 and 6). The asymmetrical location of the feature 108, allows automated pick-and-place equipment, as well as automated or human inspection processes identify the proper orientation of the pins. Such a feature may also be used to confirm location of the wire ends 94 on the first lead ends 62. The embodiment of FIGS. 1 to 7 facilitates the orientation indicating feature 108 because of the laterally extending shelf surface 40, which provides a location for a feature that does not increase the vertical or lateral footprint of the package 10. By placing the feature on the shelf surface 40, the orientation indicating feature 108 may be readily molded into the case 18 because it does not include any overhangs or other difficult-to-mold features.

Figure 8:
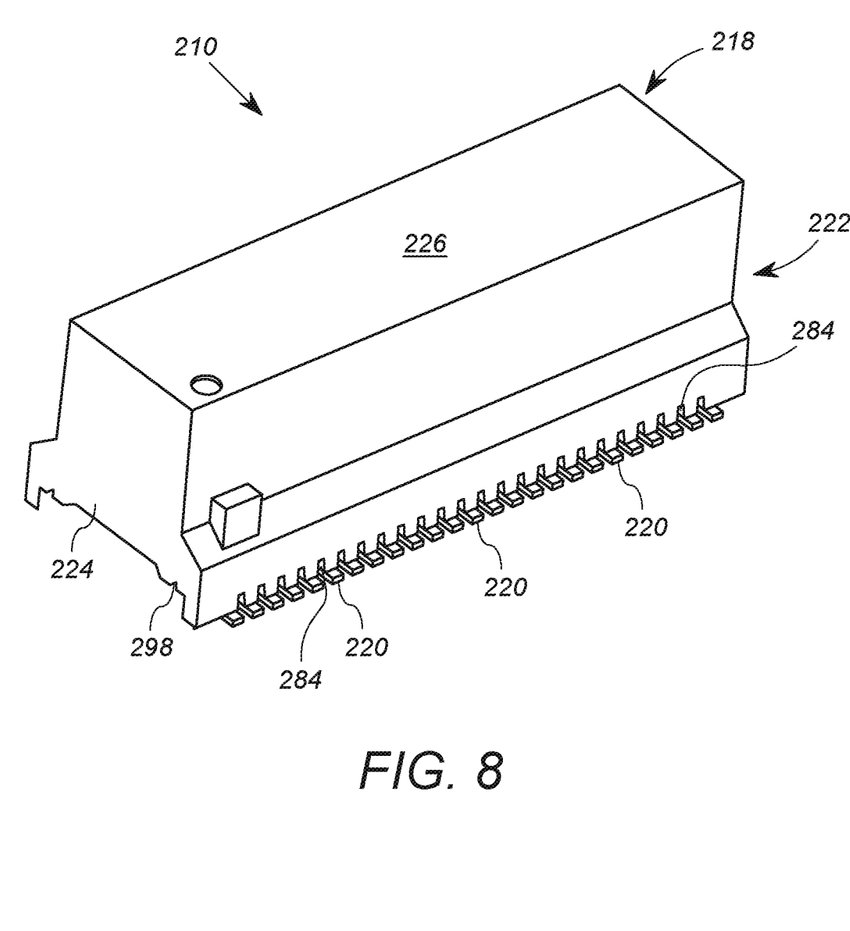
FIG. 8 shows a top perspective view of a second exemplary embodiment of an electronic device package according to the invention.
Figure 9:
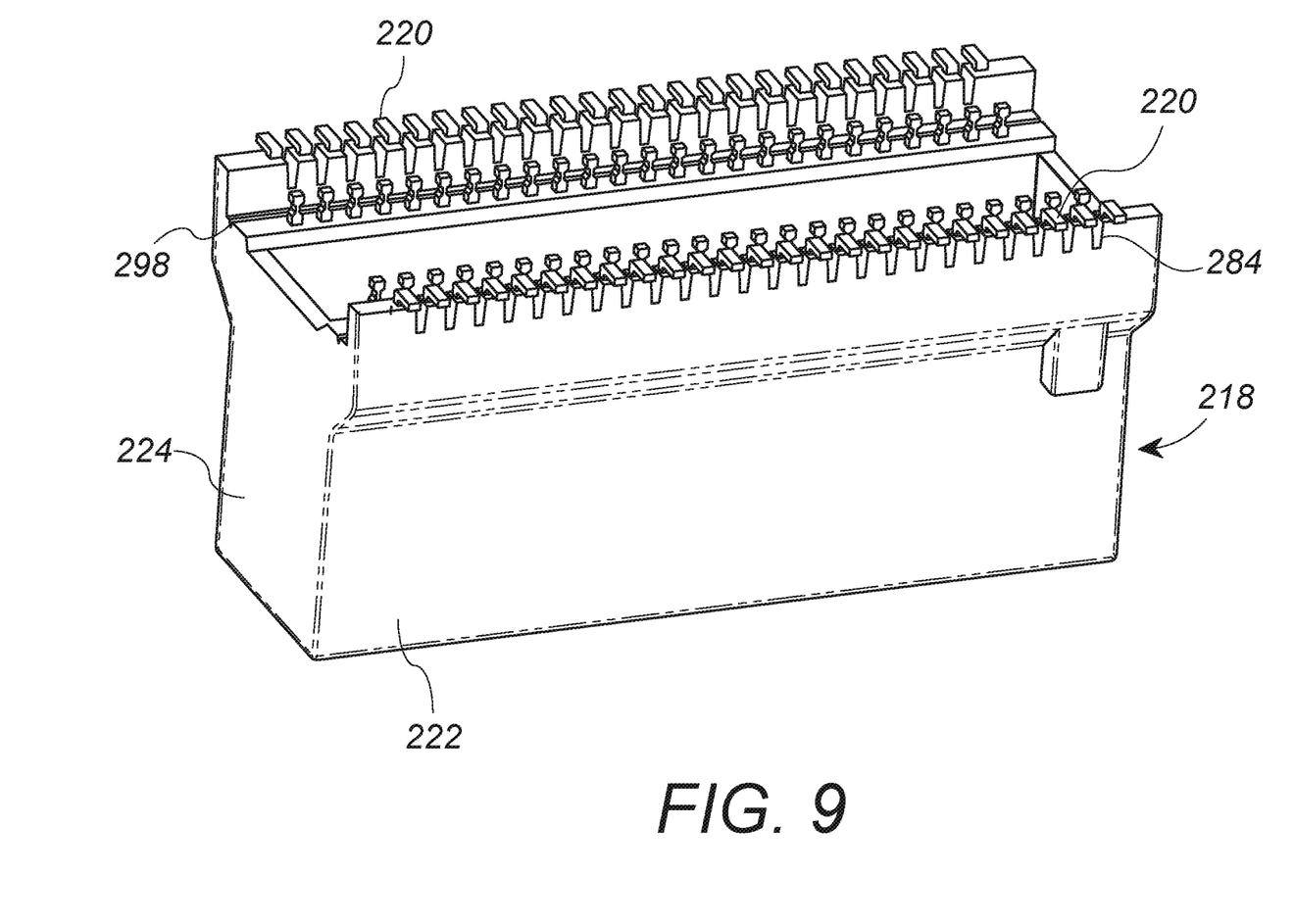
FIG. 9 shows a bottom perspective view of the electronic device package of FIG. 8.

It will be appreciated that the various features of the embodiment of FIGS. 1 to 7 may be incorporate into packages having more or less pins. FIGS. 8 and 9, for example, show perspective views of a so-called 40-pin package 210 having a molded case 218 and forty leads 220 molded therein. The package 210 incorporates side walls 222 having features and structure similar to that of the side walls 22 of FIGS. 1 to 7. The package 210 also includes analogous end walls 224 and the top wall 226. The pins 220 are molded into the case 218 in the same manner as the pins 20 molded into the case 18. The case includes a cutting channel 298 similar to the channel 98, and notches 284 similar to the notches 84.

FIGS. 8 and 9 illustrate how readily one or more advantageous features of the embodiment of FIGS. 1 to 7 may be incorporated to packages with more or less pins. These advantages include the decreased likelihood of damage to leads or pins, as compared to older design. It will be appreciated, however, that some of the advantages described herein may occur independently of others. For example, the advantages of the placement feature 108 and/or the feature of the cutting channel 98, 298 may be employed with pins or leads having a different shape.

It will be appreciated that the above-described embodiments are merely illustrative, and that those of ordinary skill in the art may readily device their own implementations and modifications that incorporate the principles of the present invention and fall within the spirit and scope thereof.

What is claimed is:

1. An electronic device package comprising:
a molded case including integrally formed side walls, end walls, and a top wall, the side walls, end walls and top wall defining an interior for receiving one or more electronic components, each side wall including a top portion, an intermediate portion, and a bottom portion, the top portion comprising a plate-like structure having first and second surfaces extending downward from the top wall, the intermediate portion including a shelf structure having a shelf surface that extends from the first surface in a direction away from the interior, and a third surface extending downward from the shelf surface, and the bottom portion extending downward from the intermediate portion;
leads molded at least in part of the intermediate portion, each lead having a first end portion exposed in the interior, and a second end portion extending along a bottom edge of the bottom portion; and wherein the second end portion extends below the bottom edge such that an upper surface of the second end portion abuts the bottom edge of the bottom portion.

2. The electronic device package of claim 1, the first, second and third surfaces extend substantially vertically downward with respect to the top wall.

3. The electronic device package of claim 1, wherein the intermediate portion has a thickness that exceeds a thickness of the top portion and exceeds a thickness of the bottom portion.

4. The electronic device package of claim 3, wherein the intermediate portion has an inner surface that is substantially coplanar with the second surface of the top portion.

5. The electronic device package of claim 4, wherein the bottom portion has an outer surface that is substantially coplanar with the third vertical surface.

6. The electronic device package of claim 5, wherein each lead includes an intermediate lead portion that extends upward from the first end portion into a bottom surface of the intermediate portion of the side wall, and extends downward toward the second end portion through the bottom surface of the intermediate portion of the side wall.

7. The electronic device package of claim 6, wherein the intermediate lead portion is substantially c-shaped.

8. The electronic device package of claim 3, wherein the each lead includes an intermediate lead portion that extends upward from the first end portion into a bottom edge of the intermediate portion of the side wall, and extends downward toward the second end portion through the bottom surface of the intermediate portion of the side wall, and wherein the bottom surface of the intermediate portion of the side wall is vertically spaced apart from the bottom edge of the bottom portion.

9. The electronic device package of claim 8, wherein the bottom surface of the intermediate portion includes a channel disposed between a position at which the intermediate portion extends to the first end portion and a position at which the intermediate portion extends towards the second end portion.

10. The electronic device package of claim 9, wherein the channel is v-shaped and extends along an entire length of the side wall.

11. The electronic device package of claim 8, wherein each intermediate lead portion extends downward toward the second end portion along an inner surface of the bottom portion of the side wall.

12. A transformer package comprising:
a molded case including integrally formed side walls, end walls, and a top wall, the side walls, end walls and top wall defining an interior for receiving one or more electronic components, each side wall including a top portion, an intermediate portion, and a bottom portion, the top portion comprising a plate-like structure having first and second surfaces extending downward from the top wall, the intermediate portion having a bottom edge, the bottom portion extending downward from the bottom edge of the intermediate portion and having a bottom edge;
leads molded at least in part of the intermediate portion, each lead having a first end portion exposed in the interior, and a second end portion extending along the bottom edge of the bottom portion, wherein each lead includes an intermediate lead portion that extends upward from the first end portion into the bottom edge of the intermediate portion of the side wall, and extends downward toward the second end portion through the bottom edge of the intermediate portion of the side wall; and wherein the second end portion extends below the bottom edge such that an upper surface of the second end portion abuts the bottom edge of the bottom portion.

13. The transformer package of claim 12, wherein the intermediate portion has a thickness that exceeds a thickness of the top portion and exceeds a thickness of the bottom portion.

14. The transformer package of claim 13, wherein the intermediate portion has an inner surface that is substantially coplanar with the second surface of the top portion.

15. The transformer package of claim 12, wherein the bottom edge of the intermediate portion includes a channel disposed between a position at which the intermediate portion extends to the first end portion and a position at which the intermediate portion extends towards the second end portion.

16. The transformer package of claim 15, wherein the channel is v-shaped and extends along an entire length of the side wall.

17. The transformer package of claim 15, wherein each intermediate lead portion extends downward toward the second end portion along an inner surface of the bottom portion of the side wall.

18. The transformer package of claim 12 wherein the plurality of pins are spaced apart from each other, and wherein the bottom portion of the side wall includes notches defined in spaces between adjacent leads.

19. The transformer package of claim 12, wherein the first end portion of each lead comprises a downward extending post.

* * * * *